US 6,583,624 B1

(12) United States Patent
Muthupillai et al.

(10) Patent No.: US 6,583,624 B1
(45) Date of Patent: Jun. 24, 2003

(54) METHOD FOR VISUALIZING CHARGED PARTICLE MOTION USING MAGNETIC RESONANCE IMAGING

(75) Inventors: Raja Muthupillai, Rochester, MN (US); Richard L. Ehman, Rochester, MN (US)

(73) Assignee: Mayo Foundation for Medical Education, Rochester, MN (US)

( * ) Notice: Subject to any disclaimer, the term of this patent is extended or adjusted under 35 U.S.C. 154(b) by 199 days.

(21) Appl. No.: 09/595,271

(22) Filed: Jun. 15, 2000

(51) Int. Cl.[7] .......................... G01V 3/00; A61B 5/055
(52) U.S. Cl. ................... 324/309; 324/307; 324/306; 600/410
(58) Field of Search ................. 324/307, 309, 324/300, 306, 318, 319, 303, 320; 600/410

(56) References Cited

U.S. PATENT DOCUMENTS

| | | | |
|---|---|---|---|
| 4,728,890 A | | 3/1988 | Pattany et al. |
| RE32,701 E | | 6/1988 | Moran |
| 5,592,085 A | * | 1/1997 | Ehman ................... 324/309 |
| 5,757,187 A | * | 5/1998 | Wollin ................... 324/306 |
| 5,825,186 A | * | 10/1998 | Ehman et al. ........... 324/309 |
| 5,899,858 A | * | 5/1999 | Muthupillai et al. ..... 600/410 |
| 5,903,516 A | | 5/1999 | Greenleaf et al. |
| 5,977,770 A | * | 11/1999 | Ehman ................... 324/318 |
| 6,037,774 A | | 3/2000 | Felmlee et al. |
| 6,150,814 A | * | 11/2000 | Redpath et al. ......... 324/307 |

* cited by examiner

Primary Examiner—Edward Lefkowitz
Assistant Examiner—Tiffany A. Fetzner
(74) Attorney, Agent, or Firm—Quarles & Brady LLP

(57) ABSTRACT

A scan using an NMR imaging system is carried out while applying an oscillating voltage to the subject being imaged. The applied voltage may produce an electric field which moves charged particles in the subject, or it may produce a current that moves ions in the subject. An alternating magnetic field gradient synchronized with the applied voltage is employed in the NMR imaging pulse sequence to detect and measure synchronous spin motion throughout the field of view. The direction of the alternating gradient and/or the applied voltage may be changed to measure and image the properties of the subject.

12 Claims, 2 Drawing Sheets

METHOD FOR VISUALIZING CHARGED PARTICLE MOTION USING MAGNETIC RESONANCE IMAGING

BACKGROUND OF THE INVENTION

The field of the invention is nuclear magnetic resonance imaging methods and systems. More particularly, the invention relates to the measurement and imaging of particle motion.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins after the excitation signal $B_1$ is terminated, this signal may be received and processed to form an image.

When utilizing these signals to produce images, magnetic field gradients ($G_x$ $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

It is well known that NMR can be used to detect and image the movement of spins. As disclosed in U.S. Pat. No. Re. 32,701 entitled, "NMR Scanner with Motion Zeugmatography", acquired NMR signals can be sensitized to detect moving spins by applying a bipolar magnetic field gradient at the proper moment in each NMR measurement sequence. The phase of the resulting NMR signal measures the velocity of spins along the direction of the motion sensitizing magnetic field gradient. With more complex motion sensitizing magnetic field gradients, higher orders of motion, such as acceleration and jerk, can also be measured with this method.

It has been found that MRI imaging can be enhanced when an oscillating stress is applied to the object being imaged in a method called MR elastography. The method requires that the oscillating stress produce shear waves that propagate through the organ, or tissues to be imaged. These shear waves alter the phase of the NMR signals, and from this the mechanical properties of the subject can be determined. In many applications, the production of shear waves in the tissues is merely a matter of physically vibrating the surface of the subject with an electromechanical device such as that disclosed in U.S. Pat. No. 5,592,085. For example, shear waves may be produced in the breast and prostate by direct contact with the oscillatory device. Also, with organs like the liver, the oscillatory force can be directly applied by means of an applicator that is inserted into the organ.

A number of methods have been devised to produce shear waves inside a subject without direct physical contact. For example, ultrasonic energy can be directed into the subject and modulated to produce forces that generate shear waves inside the subject as described in U.S. patent application Ser. No. 08/758,879 filed Dec. 2, 1996 and entitled "Acoustic Force Generator For Detection, Imaging And Information Transmission Using The Beam Signal Of Multiple Intersecting Sonic Beams". Also, in some applications, the entire subject can be shaken (e.g. the human head) and inertial forces are generated inside the subject that produce shear waves as described in co-pending U.S. patent application Ser. No. 09/057,405 filed on Apr. 8, 1998 and entitled "Inertial Drive Device For MR Elastography".

SUMMARY OF THE INVENTION

The present invention is a method for imaging a subject with an MR imaging system in which an oscillating voltage produces an electric field in the subject that moves charged particles, or produces a current through the subject that moves ions. An alternating magnetic field gradient produced by the MRI system during an image acquisition oscillates in synchronism with the applied voltage to sensitize for synchronized spin motion. The moving charged particles or ions and surrounding spins in the subject which may be set in synchronous oscillating motion, produces a phase shift in the acquired NMR signals which may be seen in reconstructed phase images.

A general object of the invention is to image the motion of charged particles or ions in a subject. By moving the particles with an oscillating electric field or current that is synchronized with an oscillating imaging gradient, the resulting movement of gyromagnetic spins may be imaged. The charged particles or ions may themselves be gyromagnetic such that their motion is seen directly in the reconstructed phase image. In addition, movement of the charged particles or ions may impart motion to surrounding gyromagnetic spins, and the observed motion of these surrounding spins in the reconstructed image provide an indirect indication of charged particle or ionic motion.

Another object of the invention is to produce shear waves in the subject material from which its mechanical properties can be measured and imaged. The charged particles or ions may be dispersed throughout the subject material and set in motion by the applied oscillating voltage. The motion of the particles applies a stress to surrounding material which produces shear waves that can be imaged with the MRI system. The location and strength of the shear waves can be tailored by the number and distribution of the particles throughout the subject material and by the strength and location of the applied voltage.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DESCRIPTION OF THE PREFERRED EMBODIMENT

Figure 1:
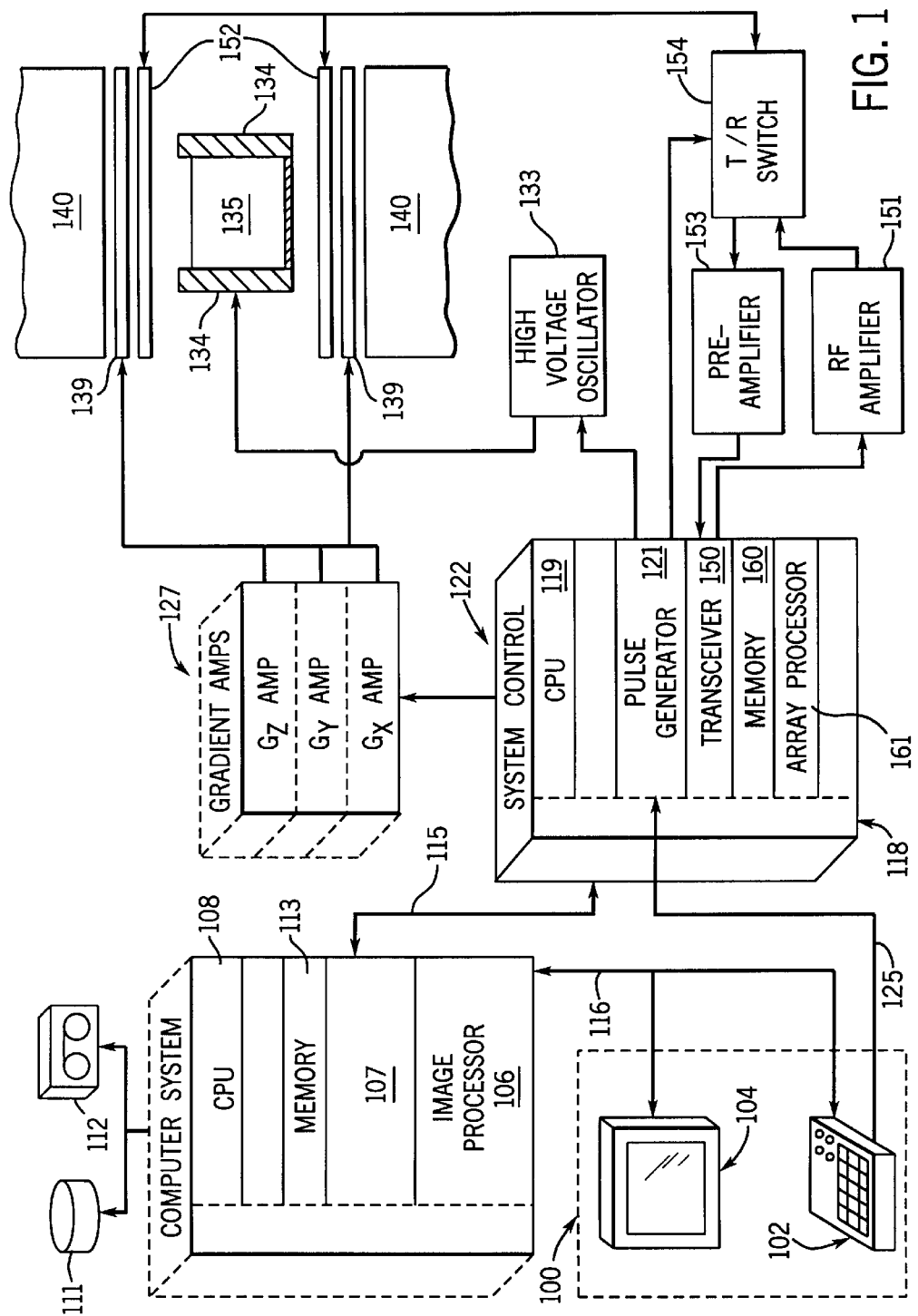
FIG. 1 is a block diagram of an MRI system which practices the present invention.

Referring first to FIG. 1, there is shown the major components of a preferred MRI system which is employed to practice the present invention. The operation of the system is controlled from an operator console 100 which includes a keyboard and control panel 102 and a display 104. The console 100 communicates through a link 116 with a separate computer system 107 that enables an operator to control the production and display of images on the display 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane 118. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also connects to a high voltage oscillator 133. As will be described in more detail below, the module 121 produces sync pulses which control the frequency and phase of an oscillating voltage produced by the oscillator 133. The oscillating voltage is applied to electrodes 134 that are disposed on opposite sides of a subject 135 to be imaged.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly which includes a polarizing magnet 140 and a RF coil assembly 152. A transceiver module 150 in the system control 122 produces pulses which are amplified by an RF amplifier 151 and coupled to the RF coil 152 by a transmit/receive switch 154. The resulting NMR signals radiated by the excited nuclei in the subject of the scan are sensed by the same RF coil assembly 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

Figure 2:
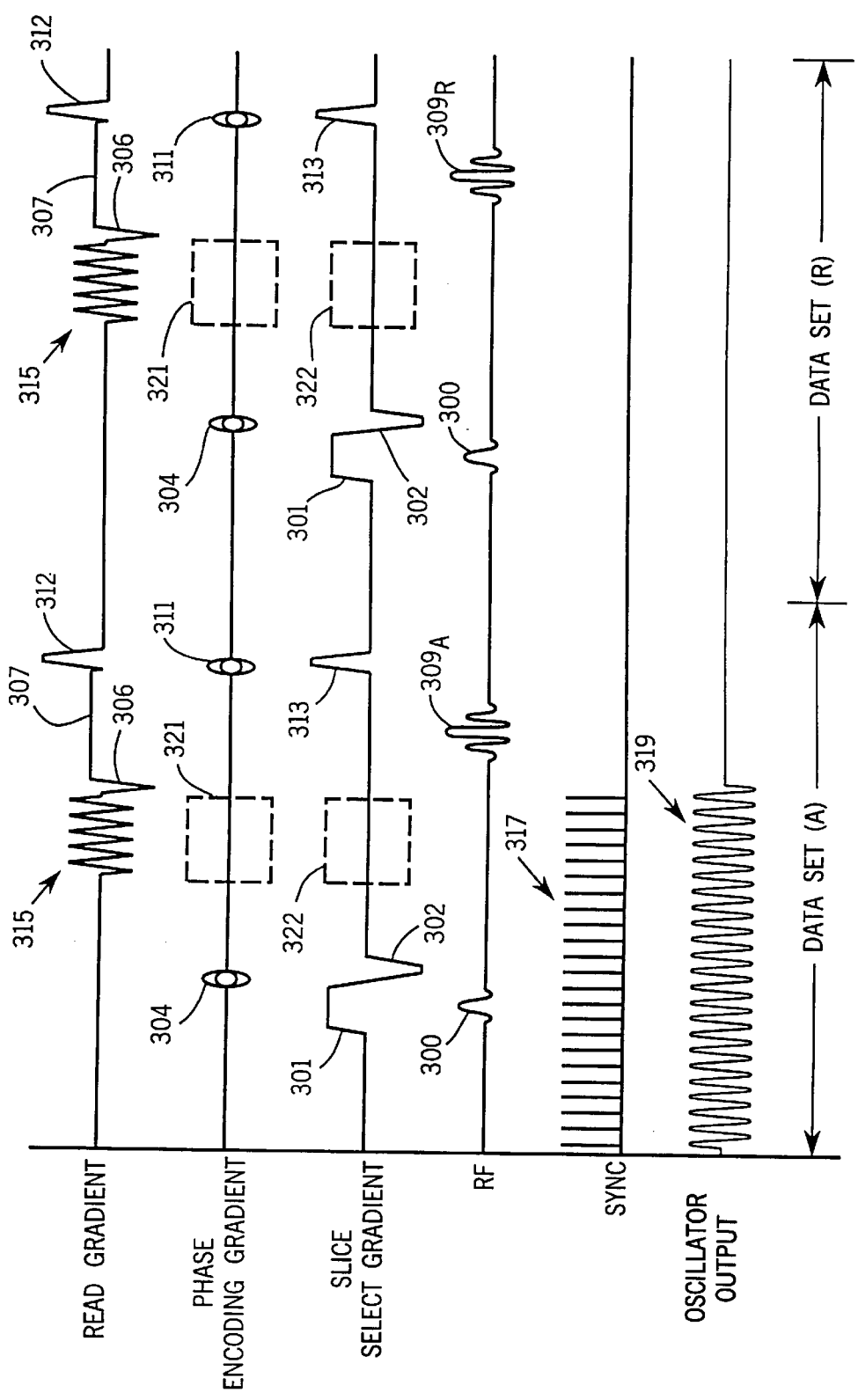
FIG. 2 is a graphic representation of a preferred pulse sequence performed by the MRI system of FIG. 1 to practice the present invention.

Referring particularly to FIG. 2, a preferred embodiment of a pulse sequence which may be used to acquire NMR data according to the present invention is shown. Actually, two pulse sequences are shown, with the first being used to acquire NMR data for a synchronous spin motion image (A), and the second being used to acquire NMR data for a reference image (R). In the preferred embodiment, these two pulse sequences are alternated throughout the scan such that the corresponding views (i.e. phase encodings) in the data sets (A) and (R) are acquired at substantially the same moment in time.

The pulse sequences are fundamentally a 2DFT pulse sequence using a gradient recalled echo. Transverse magnetization is produced by a selective 90° rf excitation pulse 300 which is produced in the presence of a slice select gradient ($G_z$) pulse 301 and followed by a rephasing gradient pulse 302. A phase encoding gradient ($G_y$) pulse 304 is then applied at an amplitude and polarity determined by the view number of the acquisition. A readout gradient ($G_x$) is applied as a negative dephasing lobe 306, followed by a positive readout gradient pulse 307. An NMR echo signal 309 is acquired 40 msecs. after the rf excitation pulse 300 during the readout pulse 307 to frequency encode the 256 digitized samples. The pulse sequence is concluded with spoiler gradient pulses 312 and 313 along read and slice select axes, and a rephasing gradient pulse 311 is applied along the phase encoding axis ($G_y$). As is well known in the art, this rephasing pulse 311 has the same size and shape, but opposite polarity of the phase encoding pulse 304. The pair of pulse sequences are repeated 128 times with the phase encoding pulse 304 stepped through its successive values to acquire a 128 by 256 array of complex NMR signal samples that comprise the data set (A) and a 128 by 256 array of complex NMR signal samples that comprise the reference data set (R).

To practice the present invention an alternating magnetic field gradient is applied after the transverse magnetization is produced and before the NMR signal is acquired. In the preferred embodiment illustrated in FIG. 2, the readout gradient ($G_x$) is used for this function and is alternated in polarity to produce five bipolar, gradient waveforms 315. The alternating gradient 315 has a frequency of 200 Hz and a duration of 25 msecs. At the same time, the pulse generator module 121 produces sync pulses as shown at 317, which are also at a frequency of 200 Hz and have a specific phase relationship with the alternating gradient pulses 315. As explained above, these sync pulses 317 activate the high voltage oscillator 133 to apply an oscillating voltage 319 to the electrodes 134 or to produce a current in the subject which has the same frequency and phase relationship. To insure that the resulting waves have time to propagate throughout the field of view, the sync pulses 317 may be turned on well before the pulse sequence begins, as shown in FIG. 2.

The phase of the NMR signal $309_A$ acquired during the first pulse sequence (A) is indicative of the movement of spins within subject 135. If the spins are stationary, the phase of the NMR signal is not altered by the alternating gradient pulses 315, whereas spins moving along the read gradient axis (x) will accumulate a phase proportional to their velocity. Spins which move in synchronism and in phase with the alternating magnetic field gradient 315 will accumulate maximum phase of one polarity, and those which move in synchronism, but 180° out of phase with the alternating magnetic field gradient 315 will accumulate maximum phase of the opposite polarity. The phase of the acquired NMR signal $309_A$ is thus affected by system phase errors and random movement of spins along the x-axis, as well as the "synchronous" movement of spins along the x-axis.

The reference pulse sequence is designed to measure the signal phase produced by sources other than synchronized spin movement. This is accomplished by repeating the identical pulse sequence, but without applying the oscillating voltage 319. As a result, the phase of the acquired NMR signal $309_R$ will be affected by "static" system phase errors caused by field inhomogeneities and the like as well as the phase due to random spin movement along the x-axis. However, there will not be a phase component due to synchronous spin movement and the reference phase $\phi_R$ can, therefore, be subtracted from the phase $\phi_A$ to yield the phase ($\phi$) due solely to synchronous spin motion. The use of the reference pulse sequence may not be required in some systems where these static system phase errors are known or are small.

The pulse sequence in FIG. 2 can be modified to measure synchronous spin movement along the other gradient axes (y and z). For example, the alternating magnetic field gradient pulses may be applied along the phase encoding axis (y) as indicated by dashed lines 321, or they may be applied along the slice select axis (z) as indicated by dashed lines 322. Indeed, they may be applied simultaneously to two or three of the gradient field directions to "read" synchronous spin movements along any desired direction.

The present invention may be implemented using most types of MR imaging pulse sequences. Gradient echo sequences can be readily modified to incorporate the alternating gradient as illustrated in the preferred embodiment. In some cases, however, the characteristics of a gradient echo sequence may not be ideal for a particular application of the technique. For example, some subjects (such as those with many interfaces between materials with dissimilar magnetic susceptibilities) may have a relatively short T2* relaxation time and therefore may not provide enough signal to obtain a noise-free image at the required echo delay time. In this setting, a spin echo implementation of the invention may be ideal, because for a given echo delay time TE, this pulse sequence is much less sensitive to susceptibility effects than a gradient echo sequence. When a spin echo pulse sequence is used, the alternating magnetic field gradient can be applied either before and/or after the 180° rf inversion pulse. However, if the alternating gradient is applied both before and after the rf inversion pulse, the phase of the alternating magnetic field gradient must be inverted 180° after the rf inversion pulse in order to properly accumulate phase.

In other applications, reduced acquisition time may be desirable. Fast spin echo and RARE sequences are rapid MRI sequences that acquire multiple views per TR cycle by applying different phase encoding gradients to each echo in a spin echo train. If 16 echoes, for instance, are acquired in each repetition of the sequence, then the total acquisition time for a complete image will be reduced by a factor of 16. One approach for modifying a fast spin echo sequence to implement the present invention is to insert the alternating gradient pulses between the initial 90° RF pulse and the first 180° RF refocusing pulse, followed by a similar but inverted set of gradient pulses. The first echo in the train might be at a TE of 40–60 msec, but the spacing between subsequent echoes could be as short as 12–15 msec.

Echo-planar imaging ("EPI") is another approach for high speed MR acquisition. In one version of this technique, the spin echo created by standard 90° and 180° RF pulses is broken up into a series of 64–128 short gradient echoes by rapidly reversing the readout gradient. A different phase encoding is applied to each of the gradient echoes and therefore the acquired data from one shot of the sequence can, in principle, be used to reconstruct a complete image. One approach for modifying such an echo-planar sequence to implement the present invention is to insert alternating gradient pulses between the initial 90° RF pulse and the 180° RF refocusing pulse, followed by a similar but inverted set of alternating gradient pulses. Such a sequence permits phase images to be obtained in only a few seconds or less.

The number of cycles of the alternating magnetic field gradient used in each pulse sequence depends on the strength of the applied gradient field, the frequency of the synchronous movement to be measured, and the TE time of the pulse sequence. The phase sensitivity of the pulse sequence to synchronous spin movement is proportional to the integrated product of alternating gradient field amplitude and the displacement over time. The sensitivity may be increased by increasing the amplitude of the gradient field pulses and by increasing the area under each pulse by making them as "square" as possible. The duration of each gradient pulse is limited by the desired synchronous frequency, and hence more cycles of the alternating gradient waveform are required at higher frequencies to produce the same sensitivity as a lower frequency alternating gradient of the same amplitude and wave shape.

Phase sensitivity to synchronous motion can also be increased by applying both the alternating gradient pulses 315 and the sync pulses 317 during the reference pulse sequence. However, when this is done the phase of the alternating magnetic field gradient 315 must be inverted 180° relative to the sync pulses 317 so that the sign of the accumulated phase is reversed. In addition, the magnetic field gradients should be flow compensated as described, for example, in U.S. Pat. No. 4,728,890 by Pattany et al., which is hereby incorporated by reference. Such flow compensation removes any phase component due to random spin motion without significantly affecting the sensitivity to synchronous spin motion. Consequently, when the phase difference image is produced the phase accumulations due to synchronous spin motion add together, while phase accumulations due to other sources subtract and are thereby nulled.

If the synchronous frequency to be measured exceeds the frequency at which the magnetic field gradient can be switched, a lower harmonic frequency may be used for the alternating gradient. As long as the time period of one cycle of the alternating gradient corresponds with an odd number of cycles of the synchronous spin motion, the phase of synchronous spin motion will accumulate. For example, the alternating gradient frequency may be ⅓, ⅕, ⅐, ⅑, etc. of the synchronous motion frequency.

The oscillating voltage 319 may be applied by the electrodes 134 in a number of ways. By starting the sync pulses 317 well before the alternating magnetic field gradient 315 as shown in FIG. 2, the synchronous spin motion propagates throughout the field of view of the reconstructed image. This will image the steady-state conditions in the subject 135 when the oscillating voltage is applied.

A phase image is produced from the two acquired NMR data sets (A) and (R). There are three methods which may be used for performing this function. In the first method a two-dimensional Fourier transformation ("2DFT") is performed on each acquired data set (A) and (R). The phase $\phi'_A$ is then calculated for each pixel location in the (A) image, and the phase $\phi'_R$ is calculated at each pixel of the (R) image.

$$\phi'_A = \text{Tan}^{-1} Q'_A II'_A$$

$$\phi'_R = \text{Tan}^{-1} Q'_R II'_R$$

The phase difference (φ) at each image pixel is then calculated by subtracting pixel values in the reference phase $\phi'_R$ from corresponding pixel values in the synchronous motion encoded phase $\phi'_A$.

The second method is referred to in the art as the complex difference technique. The first step in this method is to calculate the complex difference of the I and Q values of the corresponding sampled NMR signals in the two data sets (A) and (R). After these values are linearized, a two-dimensional Fourier transformation is performed on the resulting complex difference, and the phase φ at each pixel in the resulting image is calculated.

The third method is very similar to the first method. A two-dimensional Fourier transformation is performed on each NMR data set (A) and (R) and the complex difference between the resulting two images is calculated. The resulting values are linearized and the phase of the resulting complex difference image is calculated at each pixel.

It should be apparent to those skilled in the art that many variations are possible in the particular method used to acquire the NMR data and reconstruct an image indicative of the spin phase accumulated as a result of synchronous spin motion. As indicated above, it may not be necessary to separately acquire the (R) image and subtract its phase in systems where the static phase is known or small.

A wide variety of subjects 135 can be imaged with the present invention. The nature of the subject 135 will determine the construction of the electrodes 134 and the voltage, frequency and current capability of the high voltage oscillator 133.

In some subjects charged particles are dispersed throughout the material and a relatively high voltage is applied across the electrodes 134. This produces an oscillating electric field which applies a force to the disbursed charged particles that is proportional to their charge and the strength of the electric field. The resulting force causes the charged particles to oscillate about their mean position and is analogous to an oscillating stress that is locally applied. When the particles are electric dipoles, the resulting force is a torque about the mass center of the dipole and a rotational motion about the mean particle position results.

In subjects such as tissue, current flows between the electrodes 134 and particles in the form of ions move along the current path. In this case, the oscillating voltage is sufficient to produce current flow through the subject and the oscillator 133 has a more significant current capacity. The field produced by the electrodes 134 induces a force on the ions which is proportional to their charge.

By employing the present invention, one can study the motion of a group of charged particles placed in a non-conducting medium such as negatively charged proteins that are placed in a gel electrophoresis experiment. With each successive oscillation of the applied electric field, the charged particles travel different distances representing their relative mass. Such separation or progression and breaking up of a transient wave of charged particles can be studied. The particles start as a single "wavefront" and with more and more oscillations, the wavefront splits up and each one moves at a rate proportional to its mass as time progresses.

By using electrodes of different geometry, one can create spatially varying electric fields and these fields can also be made time varying. The motion of charged particles under the influence of these spatio-temporal field variations can be very useful for studying the electric-field distribution and thus indirectly measuring the underlying electrical properties of the material under investigation.

If the particles set in motion by the applied oscillating field are gyromagnetic spins, their motion is observed directly in the reconstructed phase image. In addition, however, the particles may be surrounded by other spins which are set in synchronous movement by the motion of the particles. The NMR signals produced by such surrounding spins will accumulate phase because of their synchronous motion, and they will be seen in the reconstructed phase image. The particles need not be gyromagnetic spins since spins which surround the particles are set in synchronous motion and can be seen. The force, or stress the particles exert on their surrounding spins can be used to estimate the viscoelastic properties of the material as described in the above-cited U.S. Pat. No. 5,592,085 which is incorporated herein by reference. In other words, by embedding charged particles in the subject and applying a synchronous oscillating field, the movement of the charged particles is used to create the synchronous stress discussed in U.S. Pat. No. 5,592,085.

It is also possible to spatially vary the distribution of charged particles. For example, drugs that are selectively accumulated in the form of charged particles in tumors can be designed. This selective accumulation can then be sued to produce a localized source of motion with an appropriate electric field. These tumors can then be visualized by the displacement caused by these charged particles in the presence of an externally applied electric field. The local changes in stiffness can serve as additional tissue characterization parameters.

With three-dimensional acquisitions and multiple axis motion encoding, it is possible to infer the preferred path of current conduction (i.e., indirect measure of the conductivity distribution of the object) within an object for a given external electrical stimulus. These paths can reflect the regional variations in tissue/object conductivity.

What is claimed is:

1. An NMR method for producing an image indicative of synchronous spin motion in a subject including charged particles, the steps comprising:
    a) applying a polarizing magnetic field to the subject;
    b) irradiating the subject with an RF excitation field that produces transverse magnetization in spins in said subject;
    c) applying a magnetic field gradient to the spins which alternates in polarity;
    d) applying a voltage to the subject which varies in magnitude in synchronism with the alternation in the magnetic field gradient polarity to produce an oscillating electric field in the subject that interacts with charged particles in the subject to produce oscillating motion of the charged particles, where the charged particles produce a stress directly on surrounding material in the subject;
    e) acquiring an NMR signal produced by the transversely magnetized spins;
    f) repeating steps a) through e) to acquire a set of said NMR signals from which an image may be reconstructed; and
    g) reconstructing a phase image from said set of NMR signals.

2. The method as recited in claim 1 in which the polarity of the magnetic field gradient alternates a plurality of times before the acquisition of the NMR signal.

3. The method as recited in claim 1 in which a second set of NMR signals is acquired from the subject without the application of said varying voltage and the phase indicated by the second set of NMR signals is subtracted from the phase indicated by the set of NMR signals.

4. The method as recited in claim 1 in which a second set of NMR signals is acquired from the subject with the alternating magnetic field gradient being oriented in a direction different than that of the alternating magnetic field gradient used to acquire said set of NMR signals, producing a second phase image from said second set of NMR signals, and producing an image indicative of a characteristic of the subject by combining said two phase images.

5. The method as recited in claim 4 in which the respective alternating magnetic field gradients used to acquire NMR signals for the two images are orthogonal.

6. A method for producing an NMR image of the motion of charged particles in a medium, the steps comprising:

applying an oscillating electric field to a medium comprising charged particles which interacts with the charged particles in the medium to produce oscillatory motion of charged particles in the medium directly;

applying an rf excitation pulse that produces transverse magnetization of spins in the medium;

acquiring an NMR image data set using a pulse sequence that employs an alternating magnetic field gradient that is synchronized with the oscillating electric field and oscillatory motion of spins in the medium;

acquiring an NMR signal from said transversely magnetized spins; and reconstructing a phase image from the NMR image data set in which each pixel in the phase image indicates the spins moving with said oscillatory motion at a corresponding location in the subject, providing an image of the oscillatory motion of the charged particles.

7. The method as defined in claim 6, wherein the motion of the charged particles produces a force on the medium.

8. The method as defined in claim 6, wherein the medium is a non-conducting gel.

9. The method as defined in claim 6, wherein the charged particles are negatively charged proteins.

10. The method as recited in claim 6 which includes:

acquiring a second NMR image data set using a pulse sequence that is the same as that used to acquire said NMR image data set except the phase of the alternating magnetic field gradient is switched 180°; and the reconstruction of the phase image includes the step of subtracting the phase information in the second NMR image data set from the phase information in the NMR image data set.

11. The method as recited in claim 10 which includes:

acquiring a second NMR image data set using a pulse sequence that is the same as that used to acquire said NMR image data set except the phase of the alternating magnetic field gradient is switched 180°; and the reconstruction of the phase image includes the step of subtracting the phase information in the second NMR image data set from the phase information in the NMR image data set.

12. A method for producing an NMR image of a subject with an MR imaging system, the steps comprising:

applying an oscillating current to the subject which interacts with ions in the subject to produce oscillatory motion of ions in the subject, the oscillatory motion of the ions producing shear waves in the subject directly;

applying an RF excitation pulse that produces transverse magnetization in spins in the subject;

acquiring an NMR image data set using a pulse sequence that employs an alternating magnetic field gradient that is synchronized with oscillatory motion of spins in the subject;

acquiring an NMR signal from said transversely magnetized spins; and reconstructing a phase image from the NMR image data set in which each pixel in the phase image indicates the spins moving with said oscillatory motion at a corresponding location in the subject.

* * * * *